United States Patent
Ra

[19]

[11] Patent Number: 6,087,223
[45] Date of Patent: Jul. 11, 2000

[54] METHOD OF FABRICATING FLASH MEMORY WITH DISSYMMETRICAL FLOATING GATE

[75] Inventor: Kyeong Man Ra, Cheongju, Rep. of Korea

[73] Assignee: LG Semicon Co., Ltd., Choongcheongbuk-Do, Rep. of Korea

[21] Appl. No.: 09/064,084

[22] Filed: Apr. 22, 1998

Related U.S. Application Data

[62] Division of application No. 08/777,384, Dec. 27, 1996, Pat. No. 5,777,359.

[30] Foreign Application Priority Data

Dec. 27, 1995 [KR] Rep. of Korea ..................... 95 58733

[51] Int. Cl.[7] .............................................. H01L 21/8247
[52] U.S. Cl. ......................... 438/260; 438/263; 438/981
[58] Field of Search ................................. 438/257, 259, 438/260, 262, 263, 264, 286, 666, 981

[56] References Cited

U.S. PATENT DOCUMENTS

| | | | |
|---|---|---|---|
| 4,671,849 | 6/1987 | Chen et al. | 156/643 |
| 4,698,128 | 10/1987 | Berglund et al. | 156/643 |
| 4,814,041 | 3/1989 | Auda | 156/643 |
| 4,902,377 | 2/1990 | Berglund et al. | 156/643 |
| 5,146,291 | 9/1992 | Watabe et al. | 257/344 |
| 5,303,185 | 4/1994 | Hazani et al. | 257/314 |
| 5,323,039 | 6/1994 | Asano et al. | 257/315 |
| 5,326,999 | 7/1994 | Kim et al. | 257/316 |
| 5,395,779 | 3/1995 | Hong | 438/263 |
| 5,502,321 | 3/1996 | Matsushita | 257/316 |
| 5,592,000 | 1/1997 | Onishi et al. | 257/315 |

*Primary Examiner*—Chandra Chaudhari
*Attorney, Agent, or Firm*—Morgan, Lewis & Bockius LLP

[57] ABSTRACT

A semiconductor flash memory device comprises a subrate, a plurality of buried bit lines, an insulation film, a floating gate, an inter-layer insulation film, and a control gate formed on the inter-layer insulation film. The fabrication method comprises forming the patterned first insulation films on the substrate, forming the gate insulation film on the substrate and between the patterned first insulation films, depositing a first poly-silicon layer on the gate insulation film and the patterned first insulation film, forming a floating gate by etching the first poly-silicon layer, forming a second insulation film on each of the floating gate and the substrate having the buried bit lines therein, and forming a control gate on the second insulation film. The flash memory device realizes high yield rate due to the simplified fabrication steps and facilitated fabrication.

8 Claims, 4 Drawing Sheets

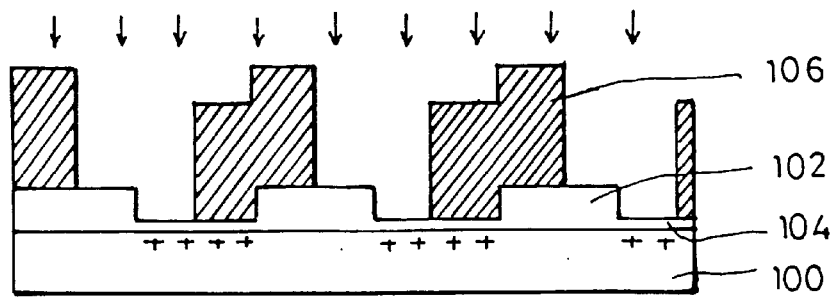
FIG. 3E
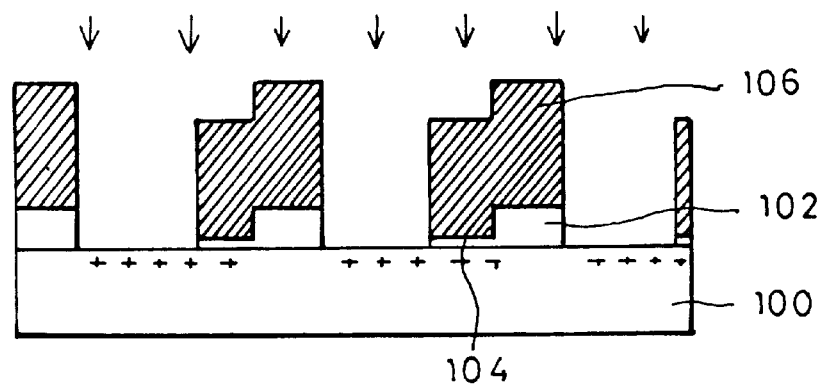
FIG. 3F
FIG. 3G
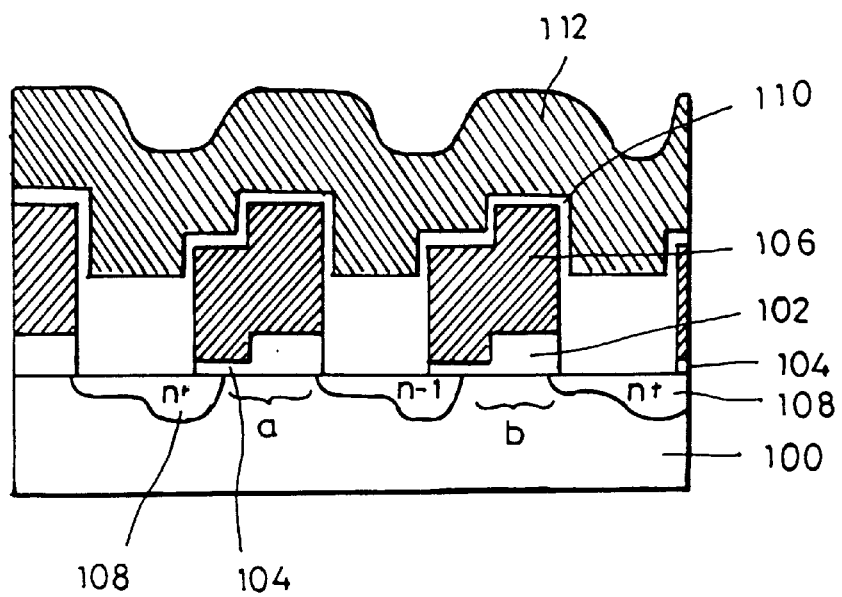

METHOD OF FABRICATING FLASH MEMORY WITH DISSYMMETRICAL FLOATING GATE

This is a divisional of copending application application Ser. No. 08/777/384 now U.S. Pat. No. 5,777.359 filed on Dec. 27, 1996.

BACKGROUND OF THE INVENTION

1. Field of the Invention

The present invention relates to a flash memory device, and more particularly to a flash memory device and fabrication method thereof for having a contactless and virtual ground structure and being appropriate for a highly integrated flash memory device fabrication.

2. Description of the Prior Art

Referring to FIG. 1, a conventional flash memory device is fabricated as following steps.

As a first step, a plurality of highly concentrated n-type regions 2 each distanced from each other to a certain extent and serving as a buried bit line are formed downwardly from the upper surface of a substrate 1. An oxide thin film is formed on the surface of the substrate 1. On the oxide thin film and between the n-type regions there is formed a mask. The mask is removed after performing a heat treatment thereon. As a result, a field oxide film 3 is formed on the n-type regions 2. On the substrate 1 and between the n-type regions 2 there is formed a gate oxidation film 4.

As a second step, floating gates 5 composed of poly-silicon are each formed on the gate oxide film 4. An insulation film 6 is grown on the floating gate 5 including the field oxide film 3. Then, the fabrication of the conventional flash memory device is completed by forming on the insulation oxide film 6 a control gate 7 using poly-silicon and serving as word lines.

With reference to FIG. 2, the layout of the conventional flash memory device fabricated through the above steps will now be described.

A plurality of buried bit lines shown as the n-type regions 2 in FIG. 2 are arrayed distancing from but parallel to each other. A plurality of word lines shown as the control gates 7 are arrayed vertical to the bit lines but parallel to each other. On each word line between the buried bit lines there are positioned floating gates 5. The field oxide film 3 is provided in overlapping regions between the buried bit lines and the word lines and in between the same. At this time, because contacts are not formed on the buried bit lines, high integration can be realized. Also, the floating gates 5 are symmetrical to left and right. At this time, a virtual ground structure denotes a mechanism in which drain/source regions in a memory cell are defined in accordance with the operation of the memory cell.

Also, to program a selected cell "a" shown in FIG. 1, a high voltage is applied to the control gate 7 and then an electric field is induced between a source region 2a and a drain region 2b, whereby hot electrons controlled by the voltage which is applied to the control gate 7 are excited in the drain region 2b and injected jumping over the gate oxide film 4 into the floating gate 5, whereby the erased cell is programmed to record data signals. The thusly operated programming is known as a hot electron injection technique.

In order to erase a cell for storing new data signals therein, the control gate 7 is regrounded and accordingly the source regions 2a and the drain regions 2b are refloated. Then, a high voltage is applied to the substrate 1 (or a bulk), for thereby eliminating against each block unit the electrons injected in the floating gate 5.

To program the flash memory device by using an FN (Fowler-Nordheim) tunnel technique instead of the hot electron injection technique, a high voltage is applied to the control gate 7 and the drain regions 2b are grounded. At this time, source regions 2a must be floated so as not to be applied to voltage. However, because the cell portion "b" as well as "a" must be concurrently programmed, the FN tunnel technique cannot be applied to the programming in the above structure.

Consequently, the previously described conventional flash memory device has a disadvantage in that despite a high integration property resulting from the contactless bit lines, the FN tunnel technique may not be applied to the programming because the floating gate 5 is symmetrical to the left and right thereof.

In general, a hot electron technique requiring several hundred $\mu$Å per cell for programming demands much more voltage than in an FN tunnel mechanism.

Conclusively, when a chip area becomes smaller to thereby lead to high integration and concentration, the hot electron technique demanding a relatively high voltage has limits in programming by means of a hot electron technique which characterizes relatively high voltage consumption.

SUMMARY OF THE INVENTION

Therefore, it is an object of the present invention to provide a flash memory device and fabrication method thereof for having a contactless and virtual ground structure by means of a floating gate which is symmetrical to the left and right and capable of programming by using an FN tunnel technique, thereby enabling a highly integrated flash memory device.

To achieve the above-described object, the flash memory device and fabrication method thereof includes a substrate, a plurality of buried bit lines formed distancing from each other to a certain extent and each having a deeper portion than another in each of the buried bit lines, an insulation film formed on the substrate between the buried bit lines so as to include parts of each of a deeper junction portion and less deep junction portion in any of the buried bit lines, and having an indented portion therein so that a portion adjacent to the deeper junction is thinner in comparison with another portion adjacent to the less deep junction, a floating gate formed on the insulation film and dissymmetrical to the left and right thereof, an inter-layer insulation film formed on the floating gate and the substrate below which the buried bit line is formed, and a control gate formed on the inter-layer insulation film.

Further, the fabrication method of the flash memory device in accordance with the present invention comprises the steps of forming a plurality of patterned first insulation films on a substrate so as to be distanced from each other to a certain extent, forming a gate insulation film on the substrate and between the patterned first insulation films, depositing a first poly-silicon layer on the gate insulation film and the patterned first insulation film, forming a floating gate by etching the first poly-silicon layer so as to expose certain parts of each of the gate insulation film and the patterned first insulation film, forming a second insulation film on each of the floating gate and the substrate having the buried bit lines therein, and forming a control gate on the second insulation film.

BRIEF DESCRIPTION OF THE DRAWINGS

FIGS. 3A through 3G are process views each showing a flash memory device fabrication method in accordance with the present invention.

DETAILED DESCRIPTION OF THE PRESENT INVENTION

The present invention is focused on providing a flash memory device having high concentration and low voltage property. With reference to the accompanying drawings, the device fabrication method will now be described.

Figure 1:
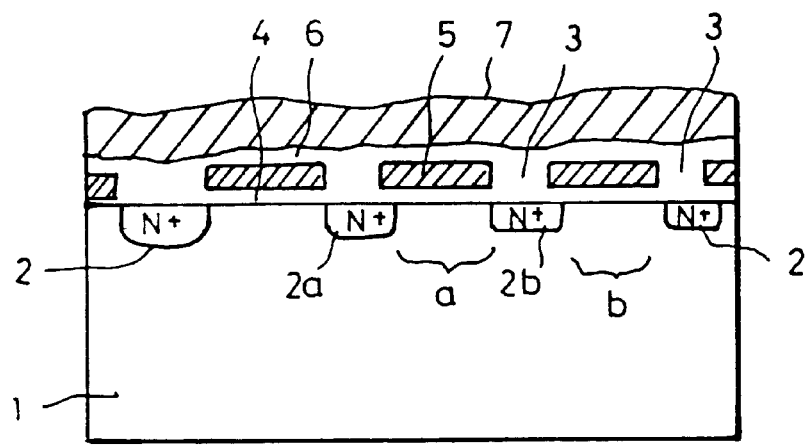
Fig. 1 is a cross-sectional structure view of a conventional flash memory device.
Figure 2:
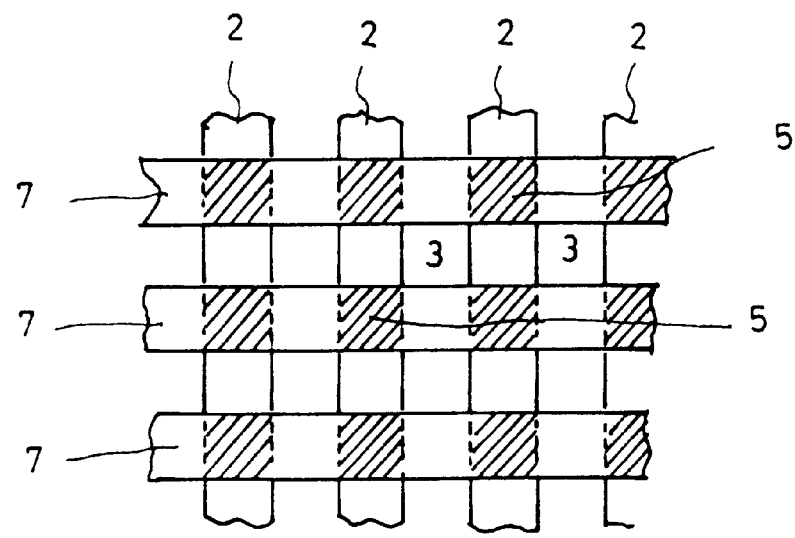
FIG. 2 is a plan view of FIG. 1 for showing a layout of the conventional flash memory device.
Figure 3A:
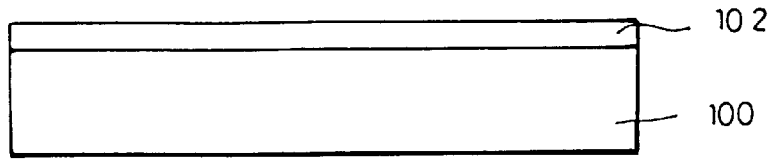

As shown in FIG. 3A, on a substrate 100 there is grown to a thickness of 300 Å to 500 Å a silicon oxide film 102 serving as a first insulation film.

Figure 3B:
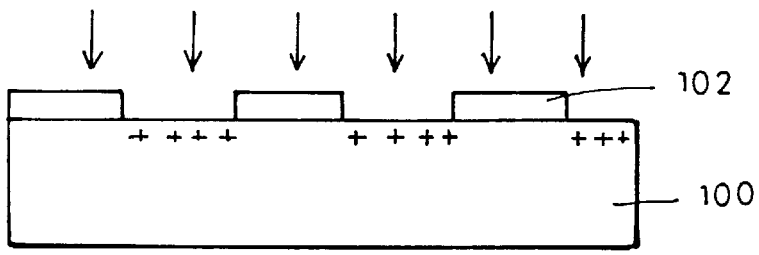

Next, as shown in FIG. 3B, using a mask the first insulation film 102 is selectively etched to expose surface portions of the substrate 100 therethrough to thereby form a patterned first insulation film 102'. Using the patterned insulation film 102' as a mask there is performed an ion implantation for controlling a threshold voltage Vt.

The formation of a first insulation film as an example having a thickness of 400 Å will now be explained.

Figure 3C:
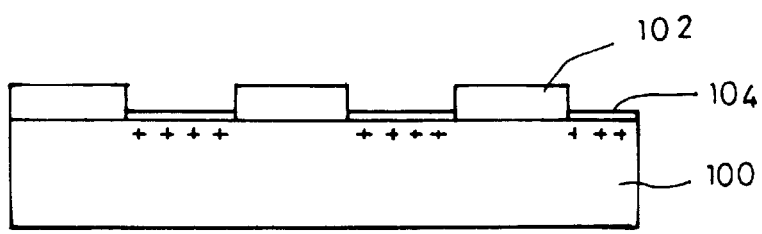

As shown in FIG. 3C, on the substrate 100 with the surface thereof selectively exposed through the patterned insulation film 102' there is grown a gate oxide film 104 having approximately 100 Å in thickness. Meanwhile, the patterned first insulation film 102' serving to prevent electrons in a cell from leaking therefrom can be also formed after the completion of the process by applying an insulation material thereto such as poly-silicon or silicon nitride film undoped by impurities, instead of a silicon oxide film.

Figure 3D:
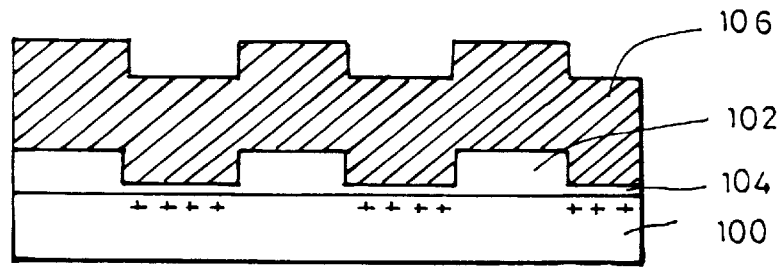

Then, as shown in FIG. 3D, a first poly-silicon layer 106 is deposited on the gate oxide film 104 and the patterned insulation film 102', respectively.

Using a mask, as shown in FIG. 3E, the first poly-silicon layer 106 is etched so that part of each surface of the patterned insulation layer 102' and the gate oxide film 104 is exposed therethrough, thereby forming a floating gate 106'. Then, n-type impurities such as phosphorus P are self-aligned and ion-implanted through the gate oxide film 104 into the substrate 100. At this time, because of the thickness of the patterned insulation film 102', the n-type impurities are not ion-implanted through the same but through the gate oxide film 104, whereby impurity regions become only formed in the substrate 100 below the gate oxide film 104.

Next, as shown in FIG. 3F, using the floating gate 106' as a mask, the patterned insulation film 102' and the gate oxide film 104 externally exposed respectively are etched and therethrough arsenic As is self-aligned and ion-implanted into the substrate 100. Then, with the application of a heat treatment there are formed a plurality of buried bit lines 108 having a deeper junction region at a portion in the substrate 100 and adjacent to the oxide film 104, and having a less deep junction region at another portion therein adjacent to the patterned insulation film 102'.

The difference of the depths in junction region results from different expansion coefficients between P and As in the substrate 100 when heat-treated in their identical conditions with regard to temperature, time and the like.

Finally, as shown in FIG. 3G, a second insulation film 110 serving as an oxide film is deposited on the substrate 100 including the floating gate 106'. A second poly-silicon layer is deposited on the second insulation film 110 and then a control gate 112 serving as a word line is formed by etching unwanted portion of the second poly-silicon using a mask, thereby completing the flash memory device fabrication.

More specifically, the buried bit lines 108 distancing from each other to a certain extend and having a side portion deeper than another side portion therein are formed in the substrate 100. A combined insulation film including the gate oxide film 104 and the patterned insulation film 102' each having a different level is formed on the substrate 100 below which each part of the deeper and less deep junction portions is positioned. The floating gate 106' which is dissymmetrical to the left and right is provided on the combined insulation film 104, 102' having a partially indented portion thereon.

Then, the second insulation film 110 is formed on the substrate 100 including the floating gate 106'. The control gate 112 is formed on the second insulation film 110, whereby the flash memory device in accordance with the present invention is completed.

Figure 4:
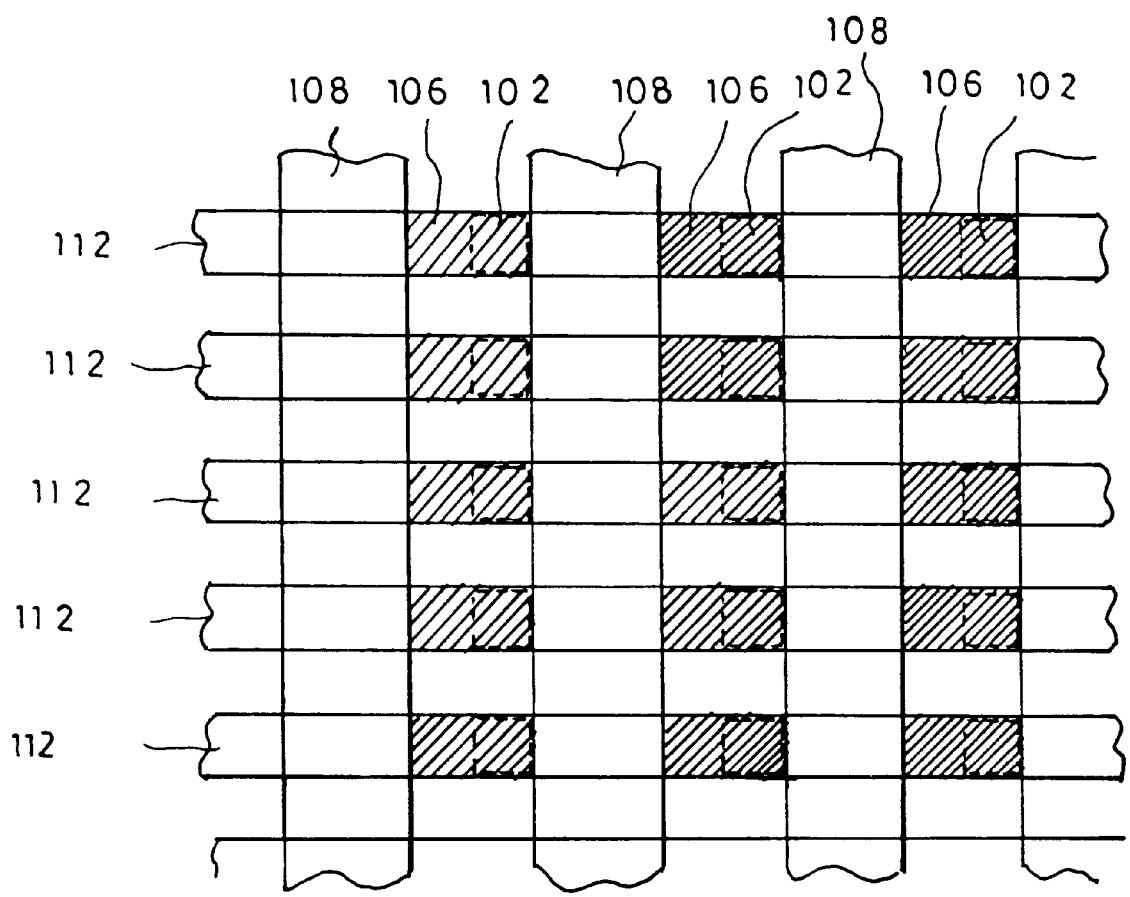
FIG. 4 is a plan view of FIG. 3G for showing a layout of the flash memory device in accordance with the present invention.

With reference to FIG. 4, the plan structure in accordance with the flash memory device of the present invention will now be described.

The plurality of buried bit lines 108 are arrayed parallel to one another but vertical to the plurality of word lines 112 which are also parallel to each of themselves. On portions of the word lines 112 between the buried bit lines 108 there are provided a floating gate 106' which is dissymmetrical to the left and right thereof. The second insulation film 110 is formed on the overlapped region crossing the buried bit lines 108 and the word lines 106'. The patterned insulation film 102' denoting the dotted areas is provided in a side of each of the floating gate 106'.

When a negative voltage ranging from −10 V to −12 V is applied to the control gate 112 and a source voltage ranging from 5 V to 3.3 V is excited to the substrate 100 and then the buried bit lines 108 are floated, the electrons in the floating gate 106' pass through the thin oxide film 104 into the substrate 100 by using an FN tunnel technique, thereby forming an erasing state in a memory cell. At this time, threshold voltage applied to the cell becomes lowered due to the absence of electrons in the floating gate 106' so that when a source voltage is applied to the control gate 112 to read data signals in the cell, a channel connecting the source and drain regions is generated, thereby producing a single state.

To fill with electrons the floating gate 106' in a cell region such as "b", the cell is selected using the bit lines 108 and the word lines 112 each formed vertical to each other.

At this time, a high voltage larger than 12 V is applied to the selected word lines 112 but zero voltage is applied to all the other word lines which are not selected. To prevent electrons from entering an unselected cell, a source voltage such as 5 V or 3.3 V is applied to all the unselected bit lines.

Subsequently, a strong electric field is induced in the selected cell between the floating gate 106' and the bit lines 108, whereby the electrons in the selected bit lines 108 pass through the thin gate oxide film 104 into the floating gate 106'. At this time, though electrons flows into the "b" floating gate via the thin gate oxide film 104, the electrons do not enter the "a" floating gate because of the interruption of the thick first insulation film 102'. In this case, electrons can be injected into the floating gate of one of the selected cells.

When the floating gates 106' are filled with electrons, the electrons cause the threshold voltage in the cell to increase. Therefore, when date signals in a cell are read by supplying the word lines with source voltage such as 3.3 V or 5 V, the channels connecting the source and drain regions are not formed due to the high threshold voltage so that electric current is not excited therein. As a result, a signal state other than the beginning one can be stored.

The programming and erasing can be performed in a method contrary to the previous description, as follows.

When a high voltage is applied to the control gate 112 but zero voltage is excited to the substrate 100 and also the buried bit lines 108 are floated, electrons in the channel regions move past the thin gate oxide film 104 into the floating gate by means of an FN tunnel technique. This can be defined as an erase state.

Then, the electrons in the floating gate 106' cause the threshold voltage Vt in a cell to increase. Therefore, data signals in a cell are read by means of supplying a relatively low voltage to the control gate 112, and the high threshold voltage results in blocking electric current in the cell. This enables one state to be stored therein.

In this case, a negative voltage ranging from −10 V to −12 V is applied to the selected word line for making a program and source voltage is applied to the bit lines 108. To prevent the electrons in the floating gate 106' of an unselected cell from leaking therefrom, zero voltage is applied to all the unselected word lines and bit lines 108.

So, a strong electric field is induced between the floating gate 106' and the bit lines 108 so that the electrons in the floating gate are sent passing through the thin gate oxide film 104 into the bit lines 108. At this time, the thick insulation film interrupts unselected cells abutting to the selected bit lines 108 from leaking the electrons therefrom.

When the floating gate 106' does not have electrons, the threshold voltage of the cell becomes lowered. Therefore, when the signals in the cell are read by applying a source voltage to a word line, a low threshold voltage forms a channel, resulting in electric current therein. A state other than the beginning one can be stored therein.

The thusly described principle enables the flash memory device to have a contactless and virtual ground structure in programming and erasing by using an FN tunnel technique.

As described above, the flash memory device having a contactless and virtual ground structure in accordance with the present invention enables the fabrication of a highly integrated memory cell requiring low voltage due to an FN tunnel technique applied to programming and erasing thereof.

Further, semiconductor chip yield rate can be improved due to the simplified fabrication steps and facilitated fabrication.

Still further, because the buried bit lines are self-aligned by means of the floating gate, the channel in the cell can be accurately defined, thereby improving cell properties.

What is claimed is:

1. A fabrication method of a semiconductor flash memory device, comprising the steps of:

forming a plurality of patterned first insulation films on a substrate so as to be distanced from each other to a certain extent;

forming a gate insulation film on the substrate and between the patterned first insulation films;

depositing a first poly-silicon layer on the gate insulation film and the patterned first insulation film;

forming a floating gate by etching the first poly-silicon layer so as to expose certain parts of each of the gate insulation film and the patterned first insulation film;

forming a second insulation film on each of the floating gate and the substrate having buried bit lines therein, the buried bit lines each having first and second regions, with the first region having a depth greater than the second region; and forming a control gate on the second insulation film.

2. The fabrication method of claim 1, wherein the first insulation film has a thickness ranging from 300 Å to 500 Å.

3. The fabrication method of claim 1, wherein the step of forming a second insulation film on each of the floating gate and the substrate having buried bit lines comprises the steps of:

first-ion-implanting conductive impurities into the substrate by self-alignment to the floating gate;

etching the patterned first insulation film exposed externally and the gate insulation film by using the floating as a mask; and second-ion-implanting conductive impurities into the substrate by self-alignment to the floating gate.

4. The fabrication method of claim 1, wherein the patterned first insulation film is selected from the group consisting of an oxide film, a nitride film and an undoped poly-silicon film.

5. A fabrication method of a semiconductor flash memory device, comprising the steps of:

forming a plurality of buried bit lines each having first and second regions, the first region having a depth greater than the second region;

forming an insulation layer on the substrate between the buried bit lines, the insulation layer having an indentation in a lower portion thereof so that a first portion of the insulation layer adjacent to the first region of the buried bit lines is thinner than a second portion adjacent to the second region of the buried bit lines;

forming a floating gate on the insulation film and having an asymmetrical shape, the floating gate having a vertical length greater than a horizontal length;

forming an inter-layer insulation layer on the floating gate and the substrate over the buried bit lines; and forming a control gate on the inter-layer insulation layer, a portion of the control gate being positioned below the floating gate.

6. The method according to claim 5, wherein the insulation layer includes a gate oxide layer and a first insulation layer.

7. The method according to claim 6, wherein the first insulation layer is selected from the group consisting of an oxide film, a nitride film, and an undoped poly-silicon film.

8. The method according to claim 6, wherein the first insulation layer has a thickness ranging from 300 Å to 500 Å.

* * * * *